United States Patent
Zheng et al.

(10) Patent No.: US 9,104,646 B2
(45) Date of Patent: Aug. 11, 2015

(54) MEMORY DISTURBANCE RECOVERY MECHANISM

(71) Applicant: Rambus Inc., Sunnyvale, CA (US)

(72) Inventors: Hongzhong Zheng, Sunnyvale, CA (US); Brent Haukness, Monte Sereno, CA (US); Mehmet Günhan Ertosun, Mountain View, CA (US); Ian P. Shaeffer, Los Gatos, CA (US)

(73) Assignee: Rambus Inc., Sunnyvale, CA (US)

( * ) Notice: Subject to any disclaimer, the term of this patent is extended or adjusted under 35 U.S.C. 154(b) by 68 days.

(21) Appl. No.: 14/098,322

(22) Filed: Dec. 5, 2013

(65) Prior Publication Data

US 2014/0164823 A1   Jun. 12, 2014

Related U.S. Application Data

(60) Provisional application No. 61/736,494, filed on Dec. 12, 2012.

(51) Int. Cl.
*G11C 11/00* (2006.01)
*G06F 11/20* (2006.01)

(52) U.S. Cl.
CPC .................. *G06F 11/2053* (2013.01)

(58) Field of Classification Search
CPC ........... G11C 13/0069; G11C 13/0004; G11C 11/406; G11C 16/3418
USPC ..................... 365/148, 222, 185.02
See application file for complete search history.

(56) References Cited

U.S. PATENT DOCUMENTS

| 5,963,473 | A  | * | 10/1999 | Norman ................... | 365/185.02 |
| 7,193,901 | B2 |   | 3/2007  | Ruby et al. | |
| 7,405,964 | B2 |   | 7/2008  | Philipp et al. | |
| 2013/0346805 | A1 | * | 12/2013 | Sprouse et al. ................. | 714/42 |

* cited by examiner

*Primary Examiner* — Huan Hoang
(74) *Attorney, Agent, or Firm* — Fenwick & West LLP

(57) ABSTRACT

Components of a memory system, such as a memory controller and memory device, which detect accumulated memory read disturbances and correct such disturbances before they reach a level that causes errors. The memory device includes a memory array and a disturbance control circuit. The memory array includes a plurality of memory rows. Each memory row is associated with a disturbance warning circuit having a state that corresponds to an accumulated disturbance in the memory row. The disturbance control circuit determines, responsive to an activation of a memory row of the plurality of memory rows specified by a row access command, whether the disturbance condition is present in the memory row based on the state of the disturbance warning circuit associated with the memory row. If a disturbance condition is present, the disturbance control circuit causes a recovery operation to be performed on the memory row to reduce the accumulated disturbances.

20 Claims, 7 Drawing Sheets

MEMORY DISTURBANCE RECOVERY MECHANISM

CROSS REFERENCE TO RELATED APPLICATIONS

This application claims priority from U.S. Provisional Application No. 61/736,494 entitled "Memory Disturbance Recovery Mechanism" and filed on Dec. 12, 2012, the contents of which are incorporated by reference herein in their entirety.

BACKGROUND

Memory systems store data in memory cells. Over time, the quality of the data deteriorates as the data is read from the memory cells. After a number of repeated accesses to the memory cells, the deterioration can cause the data to change bit values (i.e. from 0 to 1 or 1 to 0). This results in a loss of data and increases the instability of the memory system.

BRIEF DESCRIPTION OF THE DRAWINGS

The teachings of the embodiments herein can be readily understood by considering the following detailed description in conjunction with the accompanying drawings.

Figure (FIG. 1 is a memory system configured to detect memory disturbances, according to an embodiment.

DETAILED DESCRIPTION OF EMBODIMENTS

Embodiments of the present disclosure relate to components of a memory system, such as a memory controller and/or memory device, which detect and recover from potential memory read disturbances. In one embodiment, the memory device includes a memory array that includes a memory rows. The memory device also includes disturbance warning circuits, each of which is associated with one or more of the memory rows. A disturbance warning circuit has a state that corresponds to accumulated disturbances in the memory rows associated with the disturbance warning circuit. A disturbance control circuit determines, responsive to an activation of a memory row of the plurality of memory rows specified by a row access command, whether a disturbance condition is present in the memory row based on the state of the disturbance warning circuit associated with the memory row. If a disturbance condition is present, the disturbance control circuit causes a recovery operation to be performed on the memory row, e.g., to reduce the accumulated disturbances before they cause a loss of data. Advantageously, detecting disturbance conditions upon row activation and then performing disturbance recovery on a memory row corrects for accumulated disturbances only when necessary, thereby reducing energy spent on recovery operations.

In one embodiment, a memory controller controls the memory device. The memory controller comprises a control circuit and an interface circuit coupled to the control circuit. The control circuit generates a recovery timing setting that specifies a timing of the recovery operation in the memory device. The interface circuit transmits the recovery timing setting to the memory device to configure the memory device to start the recovery operation at the timing specified by the disturbance timing setting. The timing of the recovery operation may have different effects on the performance of the memory system.

Reference will now be made in detail to several embodiments of the present disclosure, examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

Figure 1:
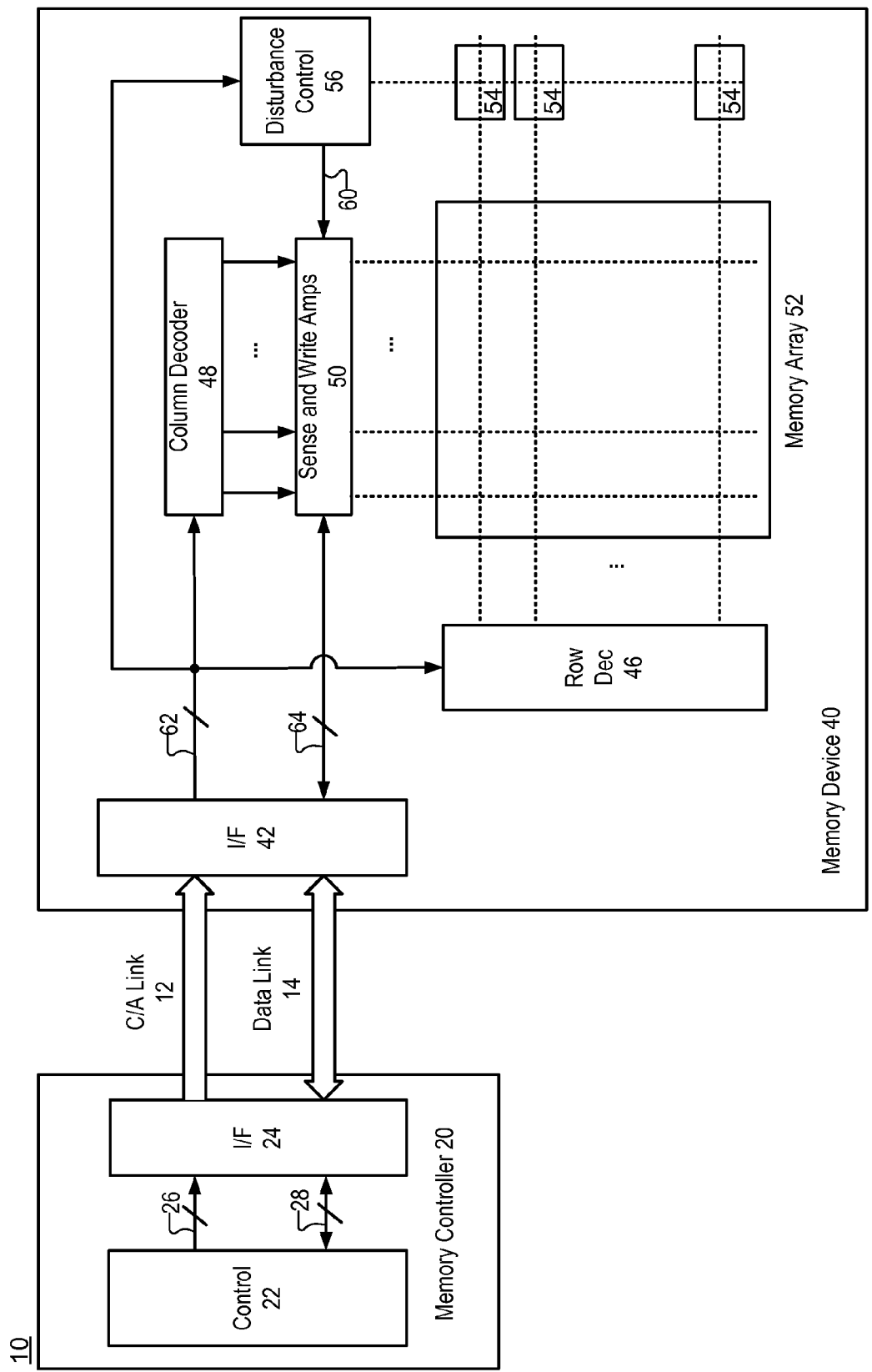

FIG. 1 is a memory system 10 for detecting and correcting for memory disturbances, according to one embodiment. The memory system 10 includes a memory controller 20 and a memory device 40 interconnected via a command and address (C/A) link 12 and a data link 14. In one embodiment, the memory controller 20 is an integrated circuit (IC) chip that is capable of controlling one or more memory devices 40 with memory commands. Examples of a memory controller 20 may be found, e.g., on a central processing unit (CPU), a graphics processing unit (GPU), a system on chip (SoC), a bridge, etc.

The memory device 40 is an integrated circuit chip that stores data under the control of the memory controller 20. In one embodiment, the memory device 40 uses resistive memory cells that are relatively non-volatile but may lose their data after a number of access cycles cause disturbances to accumulate in the memory cells. The memory device 40 may be a substitute for a conventional DRAM memory device and be compatible with DRAM-like memory access commands. The memory device 40 detects, at row activation, a memory disturbance condition in the activated row that can potentially cause a loss of data if uncorrected, and corrects for the disturbance condition before it actually causes a loss of data. In this manner, accumulated disturbances are only corrected on an as-needed basis, thereby reducing the amount of energy spent on disturbance correction. In some embodiments, the memory device 40 can detect and react to disturbance conditions on its own without the memory controller's 20 receiving information on such disturbance conditions. Although only one memory device 40 is shown in FIG. 1, in other embodiments, there may be many memory devices 40 controlled by a single memory controller 20. Additionally, the memory device 40 may be mounted on a memory module and/or in a common package along with other memory devices 40.

The memory controller 20 includes a control circuit 22 and an interface circuit 24. The control circuit 22 generates control information, including memory access commands for accessing data stored in the memory device 40. The memory access commands can include row access commands for activating a row of the memory device 40 (also known as row activate commands), column access commands for reading data from and writing data to a column of the memory device 40, pre-charge commands for closing an activated row of the memory device 40, as well as other memory access commands. The control circuit 22 also transmits data that is to be written to the memory devices 40 and receives data that is read from the memory devices 40.

The interface circuit 24 acts as the intermediary between the memory control circuit 22 and the C/A link 12 and data link 14. The interface circuit 24 is coupled to the control circuit 22 via the internal signaling links 26 and 28. The interface circuit 24 receives control information (e.g. memory commands) from the control circuit 22 via internal signaling link 26 and transmits the control information to the memory device 40 via the C/A link 12. The interface circuit 24 also transfers data with the control circuit 22 via the internal signaling link 28 and transfer data with the memory device 40 via the data link 14.

In one embodiment, the control circuit 22 generates control information including recovery timing settings. The recovery timing settings are used by the memory device 40 to control precisely when the memory device 40 starts the recovery operations after the presence of a disturbance condition is detected. The interface circuit 24 transmits the recovery timing settings to the memory device 40 in a memory access command, for example, as a flag included in a row access command or other memory command. The recovery timing settings cause the memory device 40 to start the recovery operation at certain timings, for example, (1) immediately after a row of the memory device 40 is activated by a row access command but before the memory device 40 receives the first column access command that follows the row access command, (2) after the first column access command is received by the memory device 40 or (3) after a pre-charge command is received by the memory device 40. These variations of recovery timing settings will be described in greater detail below in conjunction with FIG. 2 through FIG. 7.

The memory device 40 includes an interface circuit 42, a row decoder 46, a column decoder 48, sense and write amplifiers 50, a memory array 52, disturbance warning circuits 54, and disturbance control logic 56. In other embodiments there may be additional components or signal connections within the memory device 40, and partitioning of the array, sense and write amplifiers, disturbance warning circuit, and decoders, that are omitted herein for simplicity of illustration.

The interface circuit 42 is coupled to the C/A link 12 and receives control information from the memory controller 20 via the C/A link 12. The interface circuit 42 passes control signals based on these memory commands to the row decoder 46, column decoder 48, and disturbance recovery logic 56 via the internal signaling link 62. The interface circuit 42 is also coupled to the data link 14 and transfers data with the memory controller 42 via the data link 14. During write operations, the interface circuit 42 transmits data to the sense and write amps 50 via the internal signaling link 64 for storage in the memory array 52. During read operations, the interface circuit 42 receives data from the sense and write amps 50 via the internal signaling link 64 for transmission to the memory controller 20.

The row decoder 46 decodes the address information of row access commands. The row decoder 46 then activates a row of the memory array that corresponds to the decoded address information. Activating a row of the memory array 52 causes the data stored in a row of the memory array 52 to be pre-loaded into the sense and write amps 50.

The column decoder 48 decodes the address information of column access commands. Column access commands may be commands to read data from (read access commands) or write data to (write access commands) a portion of a memory row that was previously activated by a row access command. For read access commands, the column decoder 48 causes the sense and write amps 50 to output a column of data from the decoded column address of the activated memory row. For commands to write data, the column decoder 48 causes the sense and write amps 50 to write data to the memory array 52 at the decoded column address of the activated memory row.

The sense and write amps 50 include sense amplifiers to read data from the memory array 52 and write amplifiers to write data to the memory array 52. When a row of the memory array 52 is activated, the sense and write amps 50 pre-load the data from the activated row into the sense and write amps 50. During read operations, the sense and write amps 50 transmit the pre-loaded data at a specified column address to the interface circuit 42, where the data can then be transmitted to the memory controller 20. During write operations, the sense and write amps 50 receive data from the memory controller 20 via the interface circuit 42 and write the data to the memory array 52 at a specified column address.

The memory array 52 includes memory cells for storing data, the cells organized into rows and columns. The memory cells can store single or multibit data as an analog state that upon reading can be interpreted as a corresponding digital value. The memory cells may be "reset" to store one analog state corresponding to a digital state (e.g. digital 0), and "set" to store an analog state corresponding to a different digital value (e.g. digital 1, or other values for multibit cells). In one embodiment, the memory cells are resistive memory cells that have a programmable resistance, and the resistance of the cell represents the analog state of the cell. Each time a resistive memory cell is accessed (e.g. during a row activation), the analog resistance of the cell may change slightly. After a number of access cycles, the resistance of a memory cell may change enough that the memory cell is considered to be disturbed, i.e. the resistance of the cell no longer lies in an analog range that accurately represents the digital data that was originally programmed into the cell.

In other embodiments, the memory cells may be other types of memory cells that are susceptible to being disturbed during row activations. Examples include capacitive memory cells or floating gate memory cells, among others.

In one embodiment, each row of the memory array 52 is associated with a different disturbance warning circuit 54. Each disturbance warning circuit 54 has a state indicator that represents an amount of accumulated disturbances in its associated memory row. When the accumulated disturbances exceed a threshold, it indicates that a memory disturbance condition is present in the row. The presence of a memory disturbance condition is a sign that the data in the memory row could soon become unreliable due to repeated accesses to the memory row. The state indicator of the disturbance warning circuit thus provides an early warning of a potential future loss of data before the disturbances become severe enough to actually cause the loss of data.

Because each row has its own disturbance warning circuit 54, the presence of a disturbance condition can be determined on a row by row basis. In one embodiment, the state of a disturbance warning circuit 54 is updated every time its associated memory row is activated, in effect tracking the number of row activations. Additionally, the disturbance warning circuits 54 may be considered as part of or separate from the memory array 52 itself. In other embodiments, there may be multiple rows associated with each disturbance warning circuit 54.

In one embodiment, the disturbance warning circuits 54 are resistive memory cells that have a programmable resistance. Initially, the disturbance control circuit 56 resets the resistance of the disturbance warning circuits 54 to an initial resistance state (e.g. low resistance, or a resistance corresponding to a state most affected by disturb operations). Each time a row of the memory array 52 is activated, the disturbance warning circuit 54 for the row is also activated. This causes the resistance of the disturbance warning circuit 54 to change with repeated row activations. The disturbance recovery circuit 56 measures the resistance of the disturbance warning circuit 54, for example, by measuring a voltage across or current through the disturbance warning circuit 54, as a proxy for the resistance of the disturbance warning circuit 54. The voltage or current can be compared to a threshold level. Once a sufficient change in the resistance of the disturbance warning circuit 54 occurs, the threshold is crossed and the disturbance control circuit 54 determines that a disturbance condition sufficient to trigger correction is present.

In one embodiment, the disturbance warning circuits 54 and the cells in the memory array 52 may both be resistive memory cells. In this embodiment, the disturbance warning circuits 54 are an extension of the memory array 52. In some embodiments, each of the disturbance circuits 54 may include multiple resistive memory cells and the average resistance of the memory cells represents the resistance of the disturbance circuit. Averaging the resistance of multiple resistive cells minimizes the effect of cell resistance variation.

To ensure that the disturbance warning circuits 54 provide a warning of a disturbance condition before the memory array 52 is affected by a disturbance, the resistance characteristics of the disturbance warning circuits 54 may be biased differently than the cells of the memory array 52. As a result, the disturbance warnings circuits 54 indicate a disturbance condition before the data in the memory cells are actually affected by accumulated disturbances. Alternatively, the comparison threshold may be set to provide some margin with respect to thresholds used to determine memory cell states during read operations by setting the comparison threshold for the disturbance warning circuits 54 differently than the comparison threshold for the memory array 52.

In another embodiment, the disturbance warning circuits 54 may be counters that store counter values. Initially, the disturbance control circuit 56 resets the counter value to an initial counter value (e.g. 0). The value is adjusted (e.g. incremented or decremented) when the row associated with the counter is activated. Once the counter value crosses a threshold value, the disturbance control circuit 56 determines that a disturbance condition sufficient to trigger correction exists. The threshold value can be set to a level that allows accumulated disturbances in the memory array 52 to be acted upon before the disturbances gain a magnitude large enough to cause an uncorrectable loss of data (in an embodiment that stores error correction codes for each column of data, some loss of uncorrected data may be tolerated).

The disturbance control circuit 56 accesses the disturbance warning circuits 54 to determine whether the state of one or more of the disturbance warning circuits 54 indicates the presence of an actionable disturbance condition. The disturbance control logic 56 may, e.g., access a particular disturbance warning circuit 54 whenever a row of the memory array 56 associated with the disturbance warning circuit 54 is activated by a row access command. A disturbance condition can be present if the state of the disturbance warning circuit 54 indicates that a threshold amount of disturbances have accumulated in a memory row. If an actionable disturbance condition is present, the disturbance recovery logic 56 generates a disturbance control signal 60 to indicate that a disturbance condition was detected, which causes the sense and write amps 50 to perform a recovery operation on the memory array 52. The disturbance control circuit 56 may also reset the state of the associated disturbance warning circuit 54 for the row as the recovery operation is being performed.

In one embodiment, the disturbance control circuit 56 includes sense amplifiers for sensing the analog state of the disturbance warning circuits 54. The disturbance control circuit 56 can also include write amplifiers for programming and resetting the analog state of the disturbance warning circuits.

The sense and write amps 50 perform a preventative recovery operation on the currently active row of the memory array 52 to reduce the accumulated disturbances when the disturbance control signal 60 is asserted. The preventative recovery operation moves cells to a less-disturbed condition before additional disturbances can cause a loss of data. Beneficially, performing the recovery operation only when a disturbance condition is detected, and only on the row that the disturbance is detected for, can help reduce the amount of energy and overhead needed to perform the recovery operations.

In one embodiment, the recovery operation involves re-programming the active row of memory cells. The memory cells are re-programmed with the data values that were previously read from the memory cells during the row activation, and which are already pre-loaded into the sense and write amps 50. The memory cells are thus refreshed with their own data to compensate for any deterioration caused by previous row activations.

In one embodiment, the recovery operation involves touching up the memory cells instead of fully re-programming the active row of memory cells. The touch up operation reduces the memory disturbances by applying a shorter and/or lower voltage pulse than is typically used when programming the memory cells. For example, assuming that during a read (activate), memory cells are biased in the program direction. Over time, the resistance of reset (erased) cells will move towards the programmed state. Instead of doing a normal re-program when a disturbance condition is detected, the accumulated disturbances can be reduced by applying a short reset pulse to only the cells in the reset state. The touch up operation can be faster than a normal programming operation and reduces the impact of the disturbance correction operation on the performance of the memory device 40.

In one embodiment, performing a recovery operation on a row can include performing the recovery operation on only a strict subset of the memory cells that are susceptible to being disturbed. For example, for memory cells that are resistive in nature, row activations may only cause disturbances in the memory cells programmed to have a low resistance but do not affect the memory cells programmed to have a high resistance. Thus, only the low resistance cells need to be re-programmed during the recovery operation. Recovering only a subset of the memory cells saves energy expended for disturbance recovery, reduces the amount of time needed to perform the recovery, prevents the correction from accidentally disturbing cells that do not need to be corrected, and increases the performance of the memory device 40. In another embodiment, performing a recovery operation on a row can include performing the recovery operation on all of the memory cells in the row.

The timing of when the recovery operation starts can vary, depending on the embodiment. In one embodiment, the disturbance control circuit 56 varies the timing of the recovery operation in accordance with a recovery timing setting received from the memory controller 20. The timing recovery setting can be received, for example, as part of a memory access command to perform an operation on a memory row, such as a row access command, a column access command or a pre-charge command. The timing recovery setting can also be received as part of a mode register command that sets a timing register of the memory device 40 in accordance with the command.

The recovery operation on a row can begin any time between when the row is activated and when the row is de-activated. Examples include (1) beginning the recovery operation as soon as the disturbance condition is detected without waiting for the initial column access command (2) beginning the recovery operation after the initial column access command is received or (3) beginning the recovery operation after the pre-charge command is received. The timing of the recovery operations will now be described in conjunction with FIG. 2 through FIG. 7.

Figure 2:
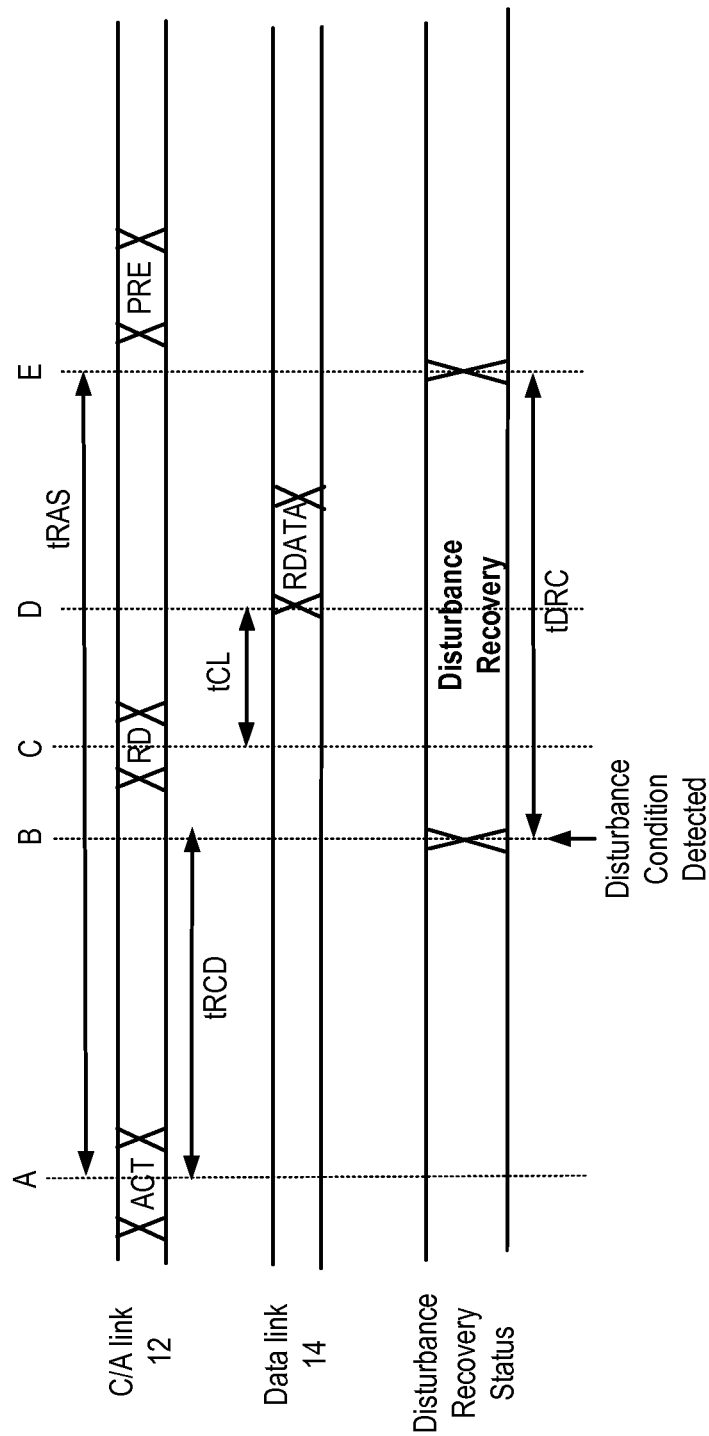
FIG. 2 is a timing diagram illustrating disturbance recovery during read operations of a memory system, such as the FIG. 1 system, according to an embodiment.

FIG. 2 is a timing diagram illustrating disturbance recovery during read operations of the memory system 10, according to an embodiment. The commands on the C/A link 12 are shown at the top of the diagram, the data transferred across the data link 14 is shown at the middle of the diagram, and the general status of the disturbance recovery operation is shown at the bottom of the diagram. At time A, the memory controller 20 transmits a row access command ACT to activate a row of the memory array 52. Between times A and B, the row specified by the row access command ACT is activated to access and pre-load data into the sense and write amps 50. The row access command ACT also activates the disturbance warning circuit 54 and causes the disturbance control circuit 56 to access the state of the disturbance warning circuit 54.

At time B, after a minimum row-to-column delay time tRCD, the state of the disturbance warning circuit 54 is now available to the disturbance control circuit 56. The disturbance control circuit 56 then determines whether a disturbance condition is present. As shown in FIG. 2, a disturbance condition is detected at time B. The disturbance control circuit 56 immediately initiates a disturbance recovery operation that starts at time B and ends at time E. The minimum disturb recovery time is indicated by tDRC.

At time C, the memory controller 20 transmits a column access command to the memory device 40 in the form of a read command RD. The read command RD is the initial command that follows the row access command ACT, i.e. it is the first command that occurs after the row access command ACT. In response, at time D, the memory device 40 starts transmitting the read data RDATA to the memory controller 20. The minimum delay between the read command RD and the transmission of read data RDATA is represented by the CAS latency tCL. A precharge command is issued after time E.

In the embodiment of FIG. 2, the disturbance recovery occurs concurrently with the processing of the read access command RD and the transfer of data RDATA. This is possible because, at time B, the read data RDATA is already pre-loaded into the sense and write amps 50. The sense and write amps 50 can thus output the data RDATA to the device interface 42 while also performing the disturbance recovery operation on the memory array 52. As a result, the disturbance recovery operation does not degrade the read latency of the memory device 40 because the memory device 40 is still capable of responding to the request for read data within the allotted CAS latency tCL time.

The recovery operation may have some timing impact on tRAS, which is the row active time and represents the minimum delay between the row access command ACT and the precharge command PRE. If tDRC is longer than tCL, then tRAS must be extended, as shown in FIG. 2, to allow the disturbance recovery tDRC to be completed before the pre-charge command PRE is issued. In other words, if (tRCD+tDRC) is longer than the original tRAS, tRAS needs to be extended to (tRCD+tDRC) to allow the disturbance recovery to be completed before the precharge command PRE is issued. However, if tDRC is shorter than tCL, tRAS can be reduced so that the recovery operation has no timing impact on tRAS.

Figure 3:
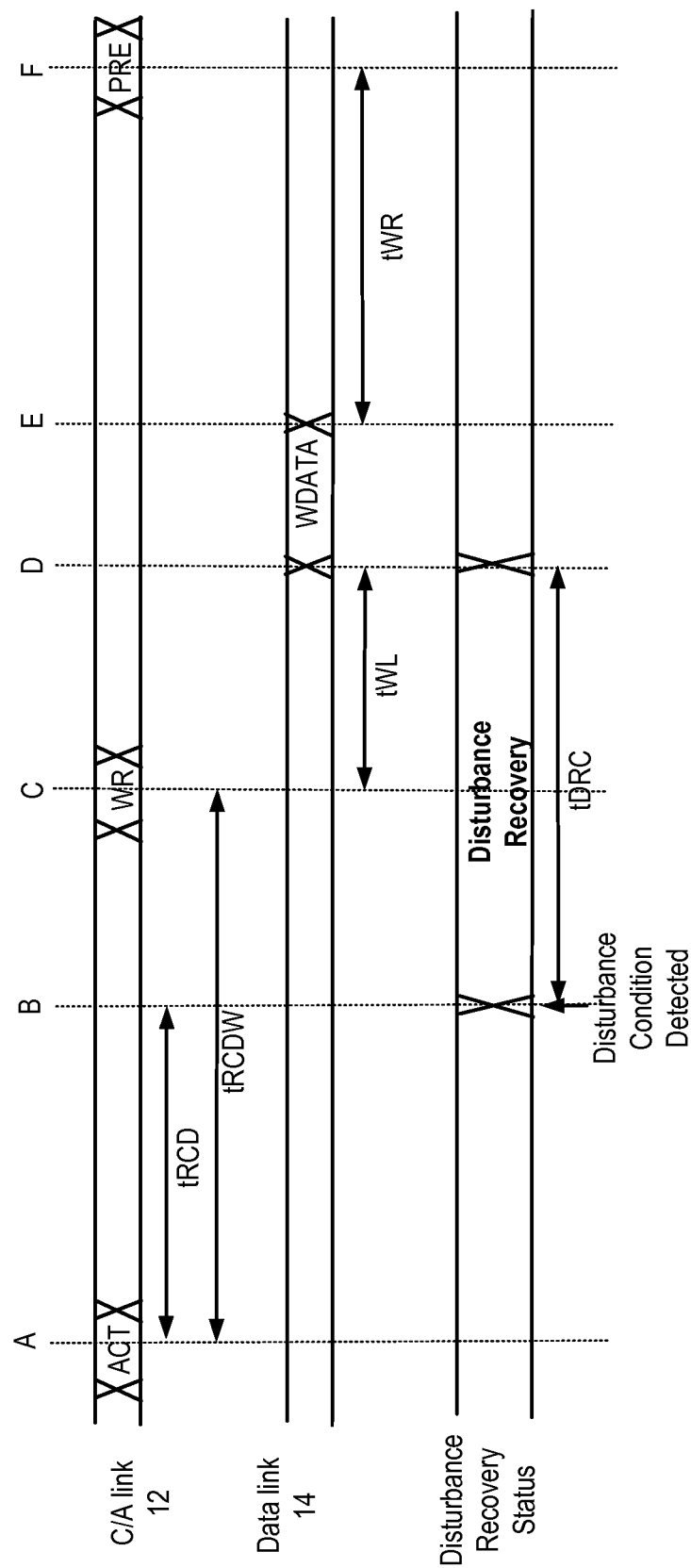
FIG. 3 is a timing diagram illustrating disturbance recovery during write operations of a memory system, such as the FIG. 1 system, according to an embodiment.

FIG. 3 is a timing diagram illustrating disturbance recovery during write operations of the memory system 10, according to an embodiment. At time A, the memory controller 20 transmits a row access command ACT to activate a row of the memory array 52. Between times A and B, the row specified by the row access command ACT is activated to access and pre-load data into the sense and write amps 50. The row access command ACT also causes the disturbance control circuit 56 to activate and access the state of the disturbance warning circuit 54.

At time B, after a minimum row-to-column delay time tRCD, the state of the disturbance warning circuit 54 is now available to the disturbance control circuit 56. The disturbance control circuit 56 determines that a disturbance condition is present. The disturbance control circuit 56 immediately initiates a disturbance recovery operation that starts at time B and ends at time D. The minimum length of the disturb recovery operation is indicated by tDRC.

At time C, the memory controller 20 transmits a column access command to the memory device 40 in the form of a write command WR. The write command WR is the initial command that follows the row access command ACT, i.e. it is the first command that occurs after the row access command ACT. The minimum delay between the row access command ACT and the write command WR is indicated by the minimum row-to-column write delay time tRCDW and in this example is longer than tRCD, which is the delay that is used for read commands. At time D, the memory controller 20 starts transmitting the write data WDATA to the memory device 40. The minimum write latency delay of the memory device 40 is indicated by tWL. The transfer of data WDATA continues between times D and E, and the memory device 40 stores the write data WDATA into the memory array 52 after the data is received. A precharge command is issued at time F. The minimum delay between the write data WDATA and the precharge command PRE is represented by the write recovery time tWR.

In the embodiment of FIG. 3, the memory device 40 completes the disturbance recovery operation at time D before it receives the write data WDATA. This prevents any conflict that may be caused by sense and write amps 50 attempting to store the data WDATA to the memory array 52 while the disturbance recovery operation on the memory array 52 is still ongoing. In order to prevent any overlap between the disturbance recovery operation and the write data WDATA, the memory controller 20 does not follow the tRCD time when transmitting write access command WR. Instead, the memory controller 20 must comply with a longer tRCDW time that provides the memory device 40 with additional time to complete the disturbance recovery operation. In other embodiments, the write latency tWL may additionally or alternatively be increased to increase the amount of time before the write data WDATA is transmitted.

FIG. 3 assumes that tDRC is longer than tWL. In other embodiments, tDRC may be shorter than tWL, which guarantees that the disturbance recovery will be completed before the write data WDATA is to be stored to the memory device 40. If so, the disturbance recovery can be performed without any timing impact on tRCDW.

Figure 4:
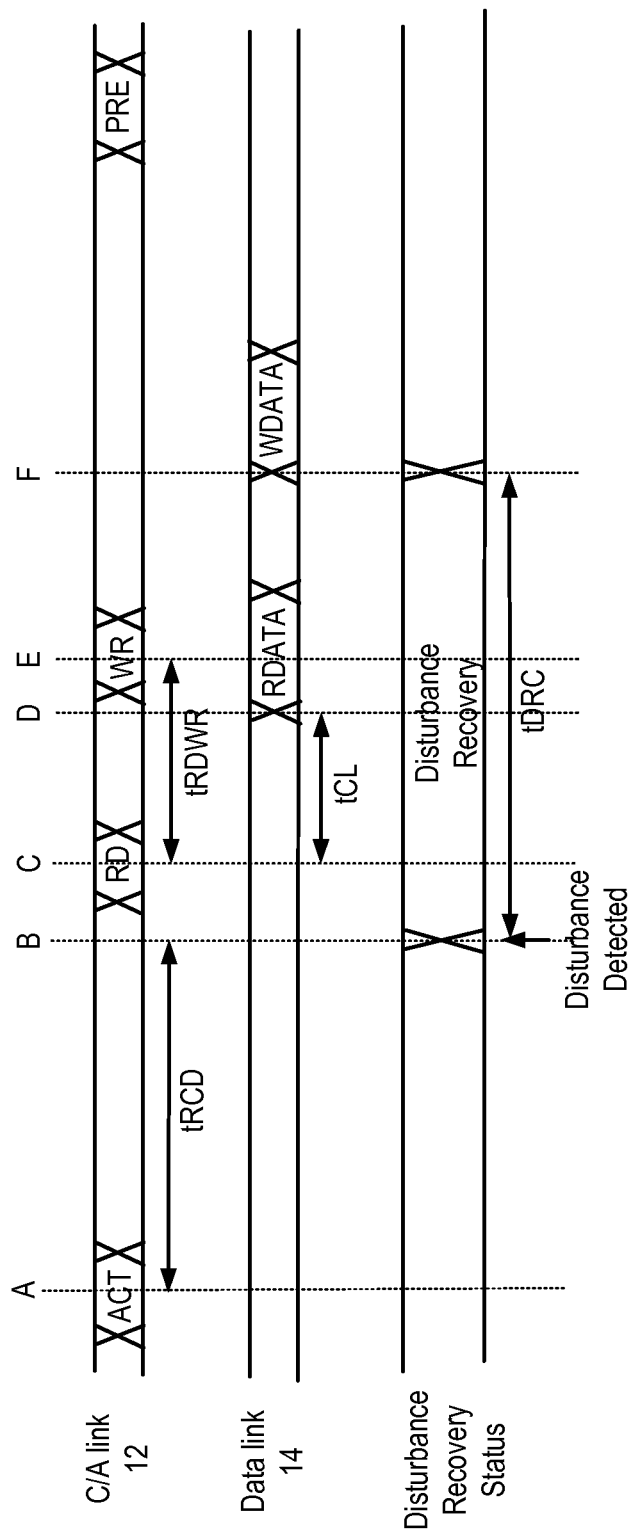
FIG. 4 is a timing diagram illustrating disturbance recovery during a read operation followed by a write operation of a memory system, such as the FIG. 1 system, according to an embodiment.

FIG. 4 is a timing diagram illustrating disturbance recovery during a read operation followed by a write operation of the memory system 10, according to an embodiment. FIG. 4 is similar to FIG. 2, but now includes an additional write access command WR at time E that follows the read access command RD at time C. The minimum delay between the read access command RD and the write access command WR is indicated by the read-to-write delay time tRDWR. tRDWR creates a read-to-write bubble when the initial read access command RD is followed by a write access command WR. The tRDWR time allows the memory device 40 to complete the disturbance recovery operation at time F before the write data WDATA is completely provided to the memory device 40 for storage to the memory device 40. This additional delay time tRDWR is only needed when the initial read access command RD is followed by a write access command WR. The additional delay time tRDWR is not needed for other back to back operations, such as RD-RD, WR-WR or WR-RD.

Figure 5:
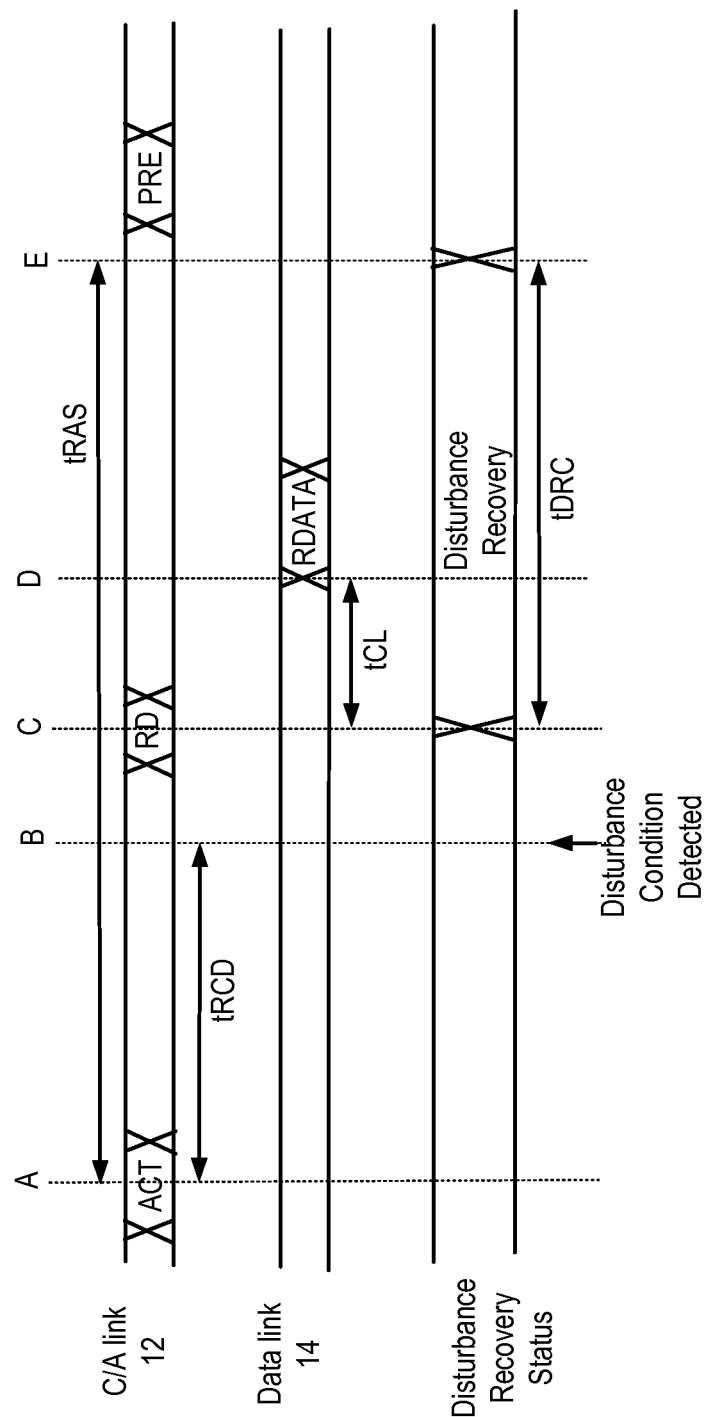
FIG. 5 is a timing diagram illustrating disturbance recovery during read operations of a memory system, such as the FIG. 1 system, according to another embodiment.

FIG. 5 is a timing diagram illustrating disturbance recovery during read operations of the memory system 10, according to another embodiment. FIG. 5 is similar to FIG. 2, except that the disturbance recovery operation does not start at time B, immediately after the disturbance condition is detected. Instead, the memory device 40 waits until the first read access command RD is received at time C before starting the disturbance recovery operation.

In FIG. 5, similar to the embodiment of FIG. 2, the disturbance recovery operation occurs in parallel with the transmission of the read data RDATA such that the disturbance recovery operation does not prevent the memory device 40 from responding to the request for read data RDATA within the allotted CAS latency time tCL. The disturbance recovery may also have a timing impact on tRAS, depending on the disturbance recovery time tDRC.

Figure 6:
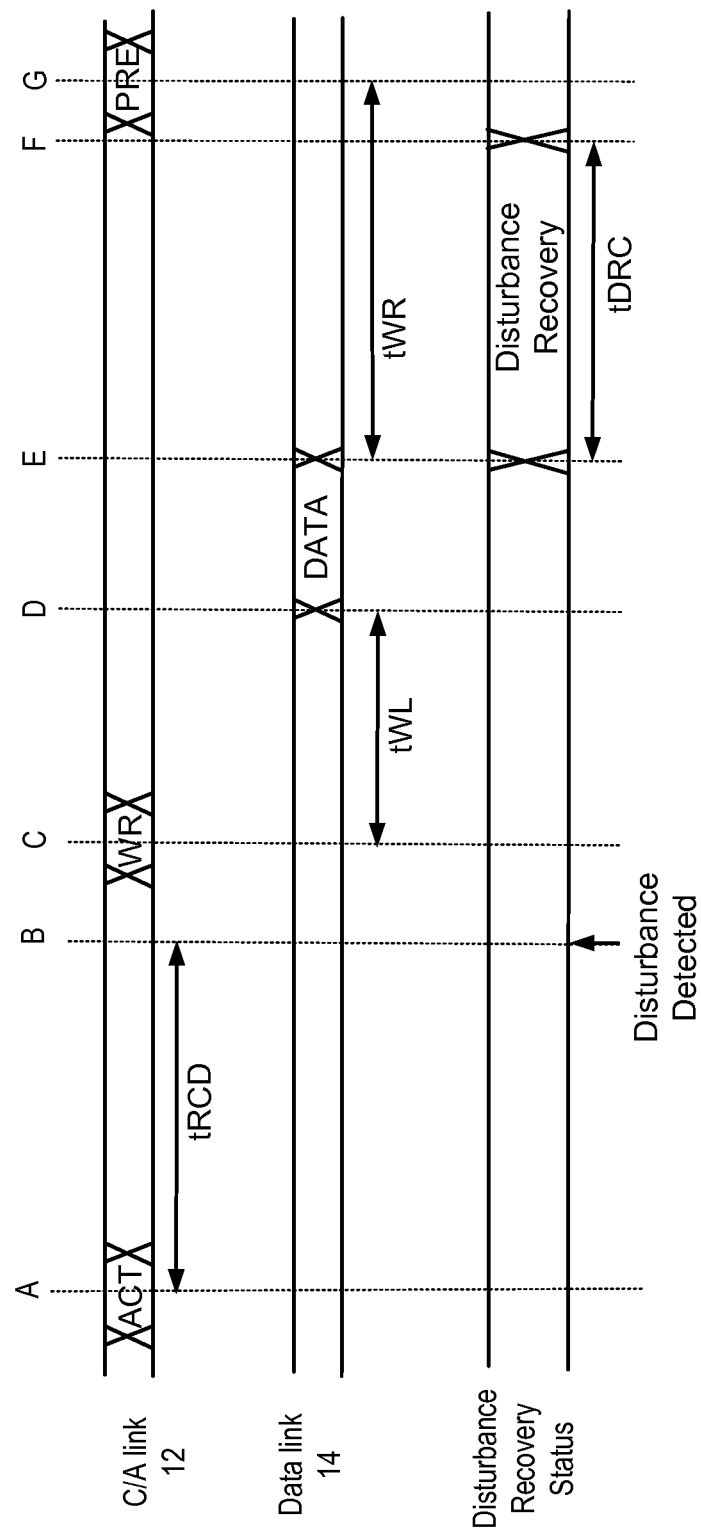
FIG. 6 is a timing diagram illustrating disturbance recovery during write operations of a memory system, such as the FIG. 1 system, according to another embodiment.

FIG. 6 is a timing diagram illustrating disturbance recovery during write operations of the memory system 10, according to another embodiment. FIG. 6 is similar to FIG. 3, except that the disturbance recovery operation does not start at time B, immediately after the disturbance condition is detected. Instead, the disturbance control circuit 56 waits until the write data WDATA is received before causing the disturbance recovery operation to be performed. The sense and write amps 50 then store the write data WDATA to the memory array 52 while also performing the disturbance recovery operation at the same time.

In FIG. 6, specifically, the write data WDATA is received by the memory device 40 between time D and time E. At time E, the write data WDATA is stored to the column address specified by the write access command WR. The disturbance recovery operation is also performed on all the remaining column addresses of the active row. Because the write data WDATA and disturbance recovery operation affect different portions (i.e. columns) of the memory row, both can be handled by the sense and write amps 50 at the same time. Beneficially, storing the write data WDATA and performing the recovery operation at the same time allows the memory controller 20 to transmit the write access command WR without having to extend tRCD.

Figure 7:
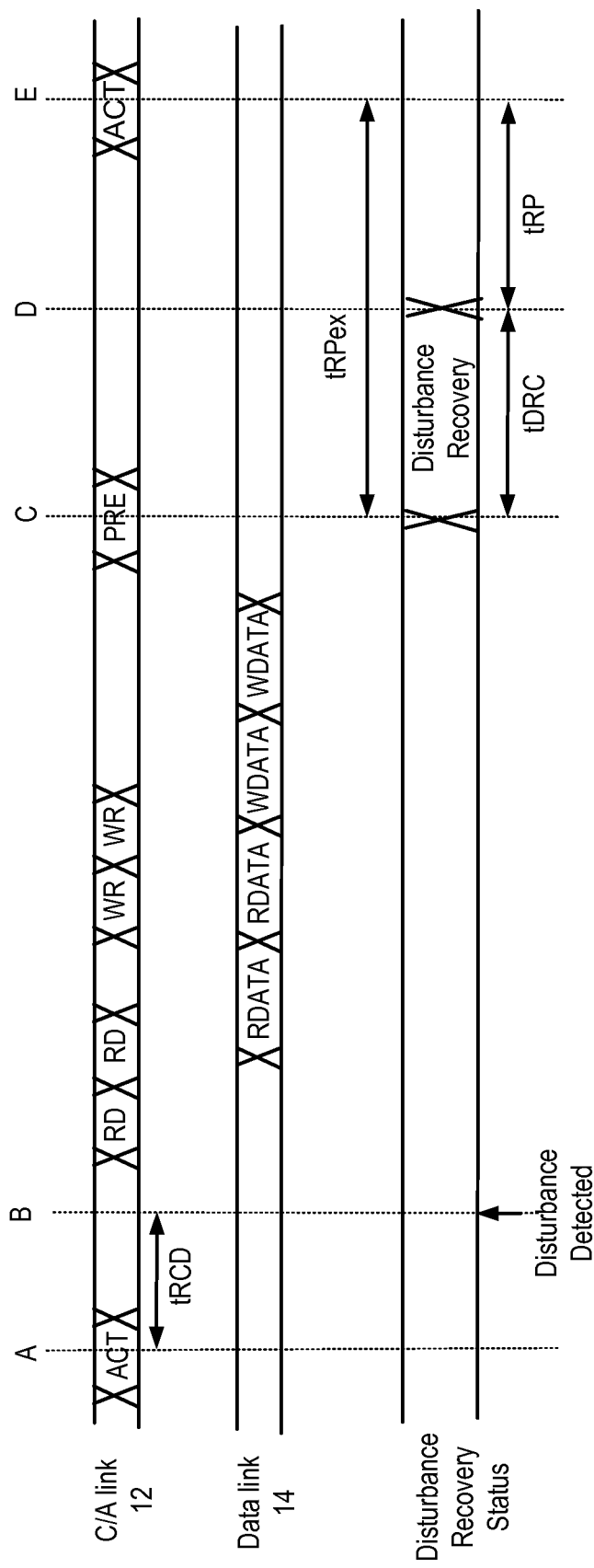
FIG. 7 is a timing diagram illustrating disturbance recovery triggered by a precharge command received by a memory device, such as the memory device of FIG. 1, according to an embodiment.

FIG. 7 is a timing diagram illustrating disturbance recovery triggered by a precharge command PRE received by the memory device 40, according to an embodiment. The memory controller 20 issues an activate command ACT at time A, and the memory device 40 detects the disturbance condition at time B. Several read access commands RD and write access commands WR are issued between time B and time C. A precharge command is issued at time C. The precharge command PRE is a command that controls the memory device 40 to close an active row of the memory array 52 so that a new row can be activated.

As shown in FIG. 7, the disturbance recovery operation does not begin until time C, when the precharge command PRE is received by the memory device 40. The disturbance recovery operation continues from time C until time D. The active row is then closed between time D and time E. At time E, a new row access command ACT is received to open a new row of the memory array 52.

The minimum delay between the precharge command PRE and the next row access command ACT when disturbance recovery is not supported is indicated by tRP. The extended row precharge time tRPex indicates the total time needed between the issuance of the precharge command PRE and the next row access command ACT when disturbance recovery is supported. tRPex is longer than tRP and accounts for the disturbance recovery time tDRC required to perform the disturbance recovery. Although the embodiment of FIG. 7 adds additional delay between a precharge command PRE and the next row access command ACT, the performance hit may be minimal because the delay only occurs when switching between memory rows.

As disclosed herein, detecting and correcting for memory disturbance conditions upon row activation allows memory devices 40 that are subject to disturbances (e.g. resistive memories) to be used in conjunction with DRAM-like memory protocols while minimizing the energy required for recovery operations. Different timings for performing the recovery can also be tailored to the needs of particular memory systems. For example, performing disturbance recovery immediately after row activation may be appropriate if the disturbance recovery can be completed quickly, and performing the disturbance recovery after the pre-charge command may be better if there is no need to activate a new row immediately after the current row is closed.

Additionally, a memory controller 20 can control the disturbance recovery behavior of the memory device 40 in several ways. In some embodiments, the memory controller 20 sets one or more mode registers in the memory device to specify when disturbance recovery is allowed, whether a full recovery or shortened recovery is to be attempted, etc. The memory device 40 then performs any needed disturbance recover operations according to the register settings.

In other embodiments, one or more disturbance recovery instructions can be encoded into a command transmitted by the memory controller 20. Because the memory controller 20 can self-determine the command sequence it will transmit, it can command the memory device 40 to perform recovery-on-activate, recovery-on-read, recovery-on-write, recovery-on-precharge, or none of the above, with the selection varying for each activated row to better fit the operating schedule and hide tDRC at an optimal place for a given command sequence. The memory controller 20 can thus select one of two or more possible delays for a given command, depending on whether recovery is allowed, and ensure that timing is not violated when recovery is allowed.

Upon reading this disclosure, those of skill in the art may appreciate still additional alternative designs for detecting and recovering from memory disturbances. Thus, while particular embodiments and applications of the present disclosure have been illustrated and described, it is to be understood that the disclosure is not limited to the precise construction and components disclosed herein. Various modifications, changes and variations which may be apparent to those skilled in the art may be made in the arrangement, operation and details of the method and apparatus of the present disclosure herein without departing from the spirit and scope of the disclosure as defined in the appended claims.

What is claimed is:

1. A method of operation in a memory device, the method comprising:
responsive to activation of a memory row specified by a row access command, determining whether a disturbance condition is present in the memory row based on a state of a disturbance warning circuit associated with the memory row, the state of the disturbance warning circuit corresponding to accumulated disturbances of the memory row; and
performing a recovery operation on the memory row to reduce the accumulated disturbances responsive to determining that the disturbance condition is present.

2. The method of claim 1, wherein the recovery operation is directed at a strict subset of memory cells in the memory row.

3. The method of claim 1, further comprising:
resetting the state of the disturbance warning circuit responsive to determining that the disturbance condition is present.

4. The method of claim 1, wherein a timing of the recovery operation is responsive to disturbance timing information received from a memory controller.

5. The method of claim 4, wherein the disturbance timing information is received as part of at least one of the row access command or another command to perform an operation on the memory row.

6. The method of claim 4, wherein the disturbance timing information is received as part of a command to set a mode register in the memory device.

7. The method of claim 1, wherein the recovery operation starts prior to receiving, for the memory row, a column access command that initially follows the row access command.

8. The method of claim 1, wherein the recovery operation starts in response to a column access command, for the memory row, that initially follows the row access command.

9. The method of claim 1, wherein the recovery operation starts in response to a de-activation command for de-activating the memory row.

10. The method of claim 1, further comprising:
transmitting read data from a column address of the memory row, the column address specified by a read access command that initially follows the row access command,
wherein the read data is transmitted concurrently with performance of the recovery operation on the memory row.

11. The method of claim 10, further comprising:
receiving a write access command, directed to the memory row, that initially follows the read access command, wherein a delay between the read access command and the write access command is sufficient to allow the recovery operation to be completed before write data for the write access command is completely received by the memory device.

12. The method of claim 1, further comprising:
storing write data to a column address of the memory row, the column address specified by a write access command that initially follows the row access command,
wherein the write data is stored after performance of the recovery operation on the memory row is completed.

13. The method of claim 1, further comprising:
storing write data to a column address of the memory row, the column address specified by a write access command that initially follows the row access command,
wherein the recovery operation is performed on remaining column addresses of the memory row other than the specified column address concurrently with storing the write data to the column address of the memory row specified by the write access command.

14. A memory device, comprising:
a memory array that includes a plurality of memory rows;
a plurality of disturbance warning circuits, each of the disturbance warning circuits associated with at least one of the memory rows and including a state that corresponds to accumulated disturbances in the at least one associated memory rows; and
a disturbance control circuit to determine, responsive to an activation of a memory row of the plurality of memory rows specified by a row access command, whether a disturbance condition is present in the memory row based on the state of a corresponding one of the disturbance warning circuits associated with the memory row, and, responsive to the disturbance condition being present, to cause a recovery operation to be performed on the memory row to reduce the accumulated disturbances.

15. The memory device of claim 14, wherein the memory rows includes resistive memory cells having programmable resistance.

16. The memory device of claim 14, wherein each of the disturbance warning circuits includes at least one resistive memory cell having a resistance that changes with repeated activation of the at least one associated memory rows, and the state of the disturbance warning circuit is based on the resistance of the at least one resistive memory cell.

17. The memory device of claim 14, wherein each of the disturbance warning circuits includes a counter storing a counter value that changes with repeated activation of the at least one associated memory rows, and the state of the disturbance warning circuit is the counter value stored in the counter.

18. The memory device of claim 14, wherein the recovery operation only affects a strict subset of memory cells in the memory row.

19. The memory device of claim 14, wherein the disturbance control circuit resets the state of the disturbance warning circuit responsive to determining that the disturbance condition is present.

20. The memory device of claim 14, wherein the disturbance control circuit controls a timing of the recovery operation responsive to disturbance timing information received from a memory controller.

* * * * *